(12) United States Patent
Yu

(10) Patent No.: US 6,300,182 B1
(45) Date of Patent: Oct. 9, 2001

(54) FIELD EFFECT TRANSISTOR HAVING DUAL GATES WITH ASYMMETRICAL DOPING FOR REDUCED THRESHOLD VOLTAGE

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/734,449

(22) Filed: Dec. 11, 2000

(51) Int. Cl.[7] ............................................. H01L 21/8238
(52) U.S. Cl. ........................................................ 438/217
(58) Field of Search ..................................... 438/217, 231, 438/232, 276, 286, 289, 311, 373, 542

(56) References Cited

U.S. PATENT DOCUMENTS

| | | | |
|---|---|---|---|
| 5,344,787 | * 9/1994 | Nagalingam et al. | 437/35 |
| 5,358,879 | * 10/1994 | Brady et al. | 437/44 |
| 5,750,435 | * 5/1998 | Pan | 438/525 |

OTHER PUBLICATIONS

Xuejue Huang et al., Sub 50–nm FinFET: PMOS, IEDM, 1999.

\* cited by examiner

*Primary Examiner*—David Nelms
*Assistant Examiner*—Quoc Hoang

(74) *Attorney, Agent, or Firm*—Monica H. Choi

(57) ABSTRACT

For fabricating a field effect transistor on a semiconductor substrate in SOI (semiconductor on insulator) technology, a pillar of semiconductor material is formed on a layer of buried insulating material. The pillar has a top surface, a left side surface, a right side surface, a front side surface, and a back side surface, and the pillar has a width and a length. A dielectric structure comprised of a hardmask dielectric material is formed on the top surface of the pillar. A first gate dielectric is formed on the left side surface of the pillar, and a second gate dielectric is formed on the right side surface of the pillar, along a gate length of the length of the pillar. A gate electrode material is deposited on the dielectric structure and on the first gate dielectric and the second gate dielectric to surround the pillar at the top surface and the left and right side surfaces of the pillar for the gate length of the pillar. A first gate dopant is implanted at an angle directed toward the gate electrode material on the left side surface of the pillar such that the first gate dopant is not implanted into the gate electrode material on the right side surface of the pillar. In addition, a second gate dopant is implanted at an angle directed toward the gate electrode material on the right side surface of the pillar such that the second gate dopant is not implanted into the gate electrode material on the left side surface of the pillar. The first gate dopant is different from the second gate dopant such that a threshold voltage at the gate electrode material of the field effect transistor is less than about 0.4 Volts. The present invention may be used to particular advantage when the first gate dopant is an N-type dopant, and when the second gate dopant is a P-type dopant.

13 Claims, 5 Drawing Sheets

US 6,300,182 B1

FIELD EFFECT TRANSISTOR HAVING DUAL GATES WITH ASYMMETRICAL DOPING FOR REDUCED THRESHOLD VOLTAGE

TECHNICAL FIELD

The present invention relates generally to field effect transistors having scaled-down dimensions, and more particularly, to a field effect transistor having dual gates with asymmetrical doping on sides of a semiconductor pillar in SOI (semiconductor on insulator) technology for reducing the threshold voltage of the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

Referring to FIG. 2, to enhance the control of electrical characteristics of a MOSFET 200, a three-sided gate electrode 202 is formed to surround a pillar 204 of semiconductor material for the MOSFET 200 formed with SOI (semiconductor on insulator) technology. FIG. 3 shows the cross sectional view of the three-sided gate electrode 202 across line A—A in FIG. 2. The pillar 204 of semiconductor material is formed on a layer of buried insulating material 206 on a semiconductor substrate 208 in SOI (semiconductor on insulator) technology, as known to one of ordinary skill in the art of integrated circuit fabrication. Typically, the semiconductor substrate 208 and the pillar 204 are comprised of silicon, and the three-sided gate electrode 202 is comprised of polysilicon. In addition, the layer of buried insulating material 206 is comprised of silicon dioxide ($SiO_2$).

A three-sided gate dielectric 210 is formed between the pillar 204 and the three sided gate electrode 202. The three-sided gate dielectric 210 is comprised of one of silicon dioxide ($SiO_2$), silicon nitride (Si3N4), or a dielectric material such as a metal oxide with a dielectric constant that is higher than the dielectric constant of silicon dioxide ($SiO_2$).

A drain and source dopant is implanted into the pillar 204 at a first side of the three-sided gate electrode 202 to form a drain 212 of the MOSFET 200 and at a second side of the three-sided gate electrode 202 to form a source 214 of the MOSFET 200. A drain contact pad 216 is formed to provide connection to the drain 212 of the MOSFET 200, and a source contact pad 218 is formed to provide connection to the source 214 of the MOSFET 200.

Referring to FIGS. 2 and 3, the channel region of the MOSFET 200 is the gate length of the pillar 204 between the drain 212 and the source 214 and covered by the three-sided gate electrode 202. Because charge accumulation within such a channel region is controlled by bias on the gate electrode 202 on three surfaces of the pillar (instead of just the one top surface of the semiconductor substrate 102 in the conventional MOSFET of FIG. 1), electrical characteristics of the MOSFET 200 formed with SOI technology is more controllable to compensate for short-channel effects of the MOSFET 200.

Referring to FIGS. 2 and 3, the width of the pillar 204 along the dimension of the dashed line A—A in FIG. 2 is relatively small in a range of from about 100 Å (angstroms) to about 250 Å (angstroms). Thus, the channel region of the MOSFET 200 is fully depleted, and the threshold voltage 200 of the MOSFET is substantially determined by the doping of the gate electrode 202. In the prior art, the gate electrode 202 is evenly doped with a same gate dopant, such as an N-type dopant (i.e., phosphorous or arsenic, for example) throughout the gate electrode 202 including at the two side surfaces of the pillar 204. Such an evenly distributed dopant however results in a relatively high threshold voltage (greater than 0.6 Volts for example) of the MOSFET 200. However, a lower threshold voltage may be desired for the MOSFET 200 having scaled down dimensions and for low power applications.

Thus, a mechanism is desired for lowering the threshold voltage of a MOSFET formed from a semiconductor pillar in SOI technology.

US 6,300,182 B1

SUMMARY OF THE INVENTION

Accordingly, in a general aspect of the present invention, dual gates of a field effect transistor formed by gate electrode material deposited at two side surfaces of a semiconductor pillar are asymmetrically doped with different types of gate dopant to lower the threshold voltage of the MOSFET.

In one embodiment of the present invention, for fabricating a field effect transistor on a semiconductor substrate in SOI (semiconductor on insulator) technology, a pillar of semiconductor material is formed on a layer of buried insulating material. The pillar has a top surface, a left side surface, a right side surface, a front side surface, and a back side surface, and the pillar has a width and a length. A dielectric structure comprised of a hardmask dielectric material is formed on the top surface of the pillar. A first gate dielectric is formed on the left side surface of the pillar, and a second gate dielectric is formed on the right side surface of the pillar, along a gate length of the length of the pillar. A gate electrode material is deposited on the dielectric structure and on the first gate dielectric and the second gate dielectric to surround the pillar at the top surface and the left and right side surfaces of the pillar for the gate length of the pillar.

A first gate dopant is implanted at an angle directed toward the gate electrode material on the left side surface of the pillar such that the first gate dopant is not implanted into the gate electrode material on the right side surface of the pillar. In addition, a second gate dopant is implanted at an angle directed toward the gate electrode material on the right side surface of the pillar such that the second gate dopant is not implanted into the gate electrode material on the left side surface of the pillar. The first gate dopant is different from the second gate dopant such that a threshold voltage at the gate electrode material of the field effect transistor is less than about 0.4 Volts. The present invention may be used to particular advantage when the first gate dopant is an N-type dopant, and when the second gate dopant is a P-type dopant.

In this manner, the threshold voltage of the field effect transistor is lowered such that the dimensions of the field effect transistor may be further scaled down with scaling down of the bias voltages. Such lower bias voltages are also advantageous for field effect transistors in low power applications.

These and other features and advantages of the present invention will be better understood by considering the following detailed description of the invention which is presented with the attached drawings.

BRIEF DESCRIPTIONS OF THE DRAWINGS

FIGS. 4, 5, 6, 7, 8, 9, 10, 11, 12, 13, and 14 show isometric and cross-sectional views for illustrating the steps for fabricating a MOSFET (Metal Oxide Semiconductor Field Effect Transistor) with a semiconductor pillar having dual gates at the two side surfaces of the pillar with asymmetrical doping to lower the threshold voltage of the MOSFET.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 1:
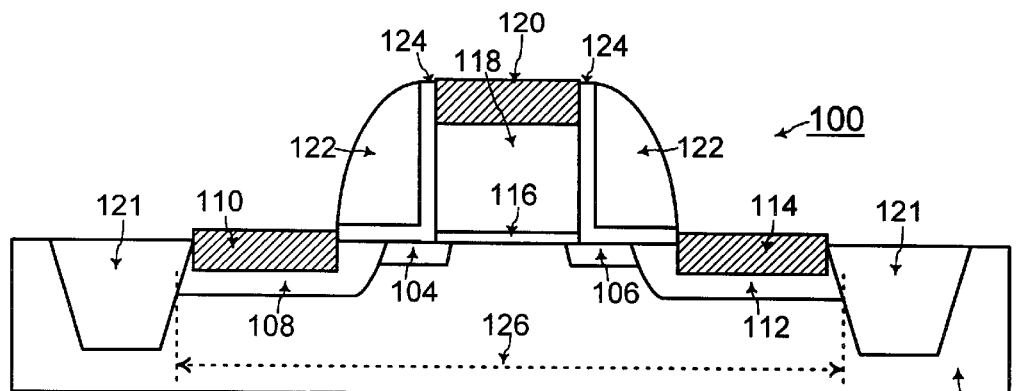
FIG. 1 shows a cross-sectional view of a conventional planar MOSFET (Metal Oxide Semiconductor Field Effect Transistor) with the gate electrode disposed over a single surface of the semiconductor substrate.
Figure 2:
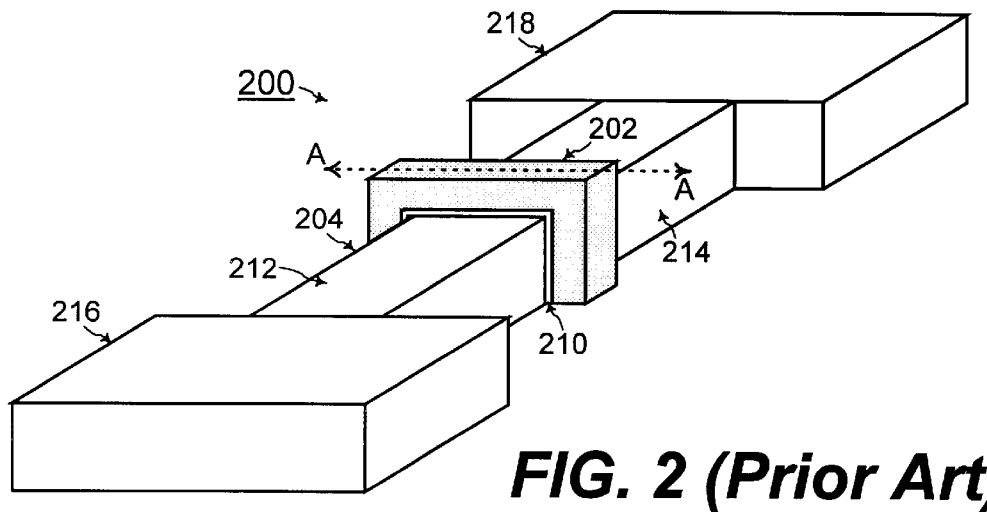
FIG. 2 shows an isometric view of a MOSFET (Metal Oxide Semiconductor Field Effect Transistor) fabricated in SOI (semiconductor on insulator) technology with a three-sided gate electrode surrounding three surfaces of a silicon pillar, according to the prior art.
Figure 3:
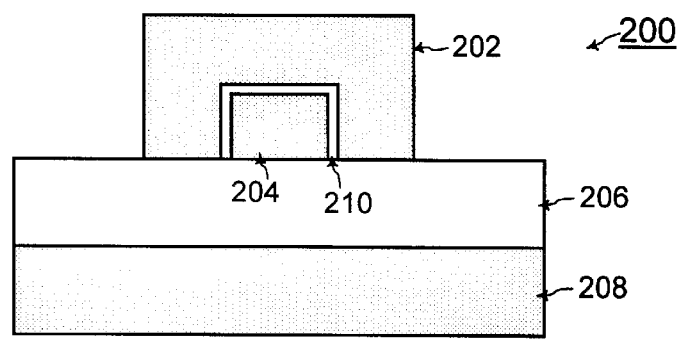
FIG. 3 shows a cross sectional view of the three-sided gate electrode surrounding three surfaces of the silicon pillar of FIG. 2.
Figure 4:
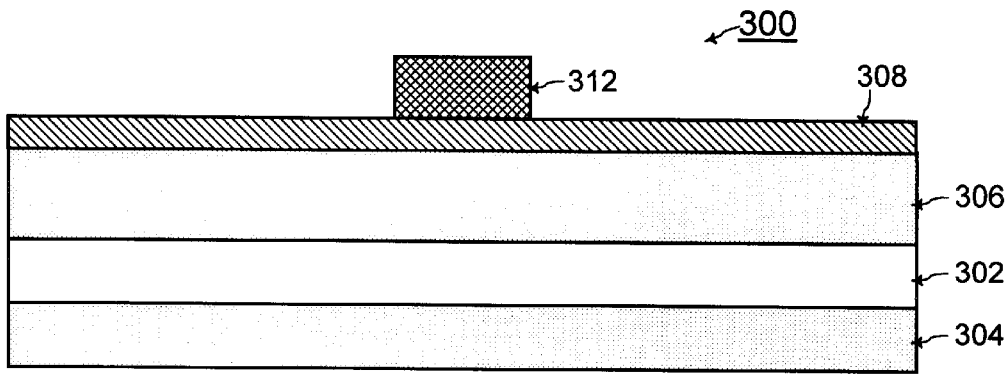

Referring to FIG. 4, for fabricating a MOSFET 300 in SOI (semiconductor on insulator) technology, a layer of buried insulating material 302 is formed on a semiconductor substrate 304. The semiconductor substrate 304 is typically comprised of silicon, and the layer of buried insulating material 302 is typically comprised of silicon dioxide ($SiO_2$). A layer of semiconductor material 306 for forming a pillar is deposited on the layer of buried insulating material 302. The layer of semiconductor material 306 is comprised of silicon having a thickness in a range of from about 400 Å (angstroms) to about 600 Å (angstroms) according to an embodiment of the present invention. Processes for deposition of the layer of buried insulating material 302 and the layer of semiconductor material 306 are known to one of ordinary skill in the art of integrated circuit fabrication.

A layer of hardmask dielectric material 308 is deposited on the layer of semiconductor material 306. In one embodiment of the present invention, the layer of hardmask dielectric material 308 is comprised of silicon nitride ($Si_3N_4$) having a thickness in a range of from about 300 Å (angstroms) to about 600 Å (angstroms). Processes for deposition of the layer of hardmask dielectric material 308 are known to one of ordinary skill in the art of integrated circuit fabrication.

Figure 5:
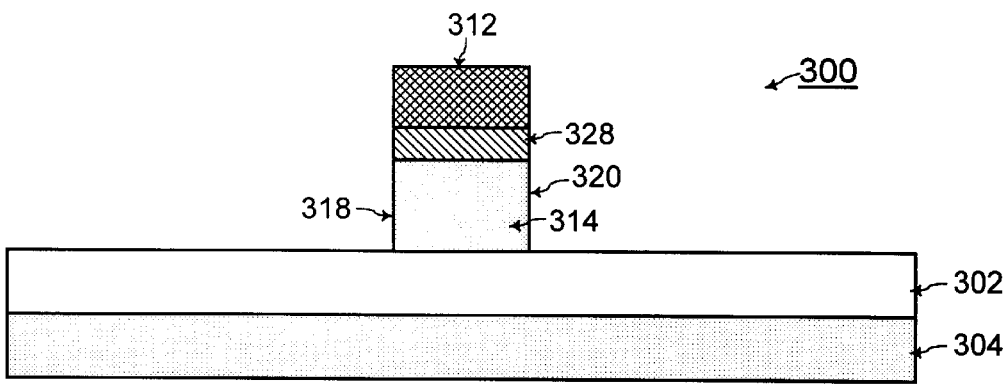

Further referring to FIG. 4, a layer of photoresist material 312 is deposited and patterned to have a width and a length of a pillar to be formed from the layer of semiconductor material 306. Referring to FIGS. 4 and 5, any region of the layer of hardmask dielectric material 308 and the layer of semiconductor material 306 not masked by the photoresist material 312 is etched away to form a pillar 314 of the semiconductor material 306. Processes for patterning and etching the layer of hardmask dielectric material 308 and the layer of semiconductor material 306 are known to one of ordinary skill in the art of integrated circuit fabrication.

Figure 6:
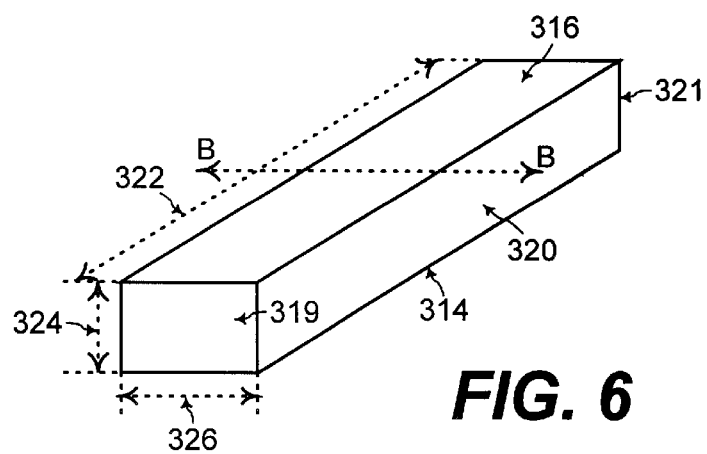

FIG. 6 shows an isometric view of the pillar of semiconductor material 314. Referring to FIGS. 5 and 6, the pillar 314 of the semiconductor material 306 has a top surface 316, a left side surface 318, a right side surface 320, a front side surface 319, and a back side surface 321. The cross-sectional view of the pillar 314 of FIG. 5 is across the dashed line B—B in FIG. 6. Further referring to FIG. 6, the pillar 314 has a length 322, a height 324, and a width 326. In one embodiment of the present invention, the height 324 of the pillar 314 is in a range of from about 400 Å (angstroms) to about 600 Å (angstroms), and the width 326 of the pillar 314 is in a range of from about 100 Å (angstroms) to about 250 Å (angstroms).

Figure 7:
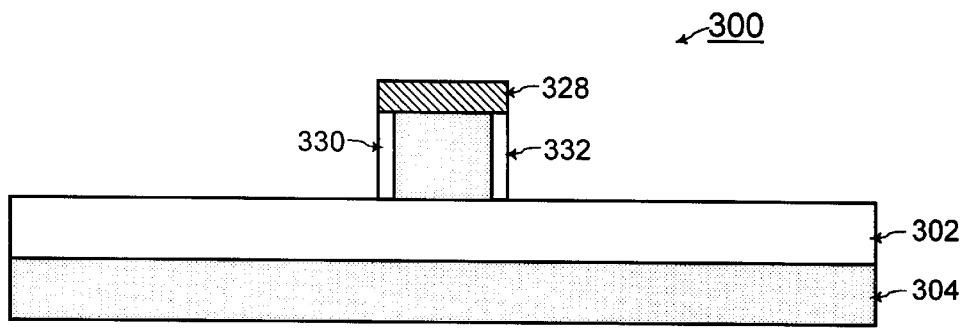

Referring to FIG. 5, the pillar 314 has the silicon nitride ($Si_3N_4$) of the layer of hardmask dielectric material 308 remaining to form a dielectric structure 328 on the top surface 316 of the pillar 314. Referring to FIGS. 5 and 7, the photoresist material 312 is removed from the dielectric structure 328 on the top surface 316 of the pillar 314. For forming a dual gate MOSFET 300, a first gate dielectric 330 is formed on the left side surface 318 of the pillar 314, and a second gate dielectric 332 is formed on the right side surface 320 of the pillar 314. In one embodiment of the present invention, the first gate dielectric 330 and the second gate dielectric 332 are comprised of silicon dioxide (SiO$_2$) having a thickness in a range of from about 15 Å (angstroms) to about 25 Å (angstroms), and processes for formation of such gate dielectrics such as thermal oxidation processes are known to one of ordinary skill in the art of integrated circuit fabrication.

Figure 8:
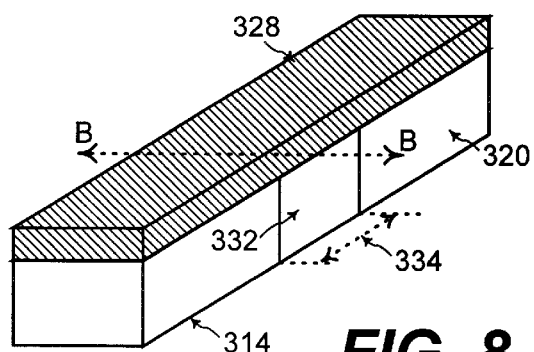

FIG. 8 shows an isometric view of the dielectric structure 328 on the semiconductor pillar 314. In addition, FIG. 8 illustrates that the first gate dielectric 330 and the second gate dielectric 332 are formed for a gate length 334 of the pillar 314 along the length 322 of the pillar 314. The cross-sectional view of the pillar 314 of FIG. 7 is across the dashed line B—B in FIG. 8.

Figure 9:
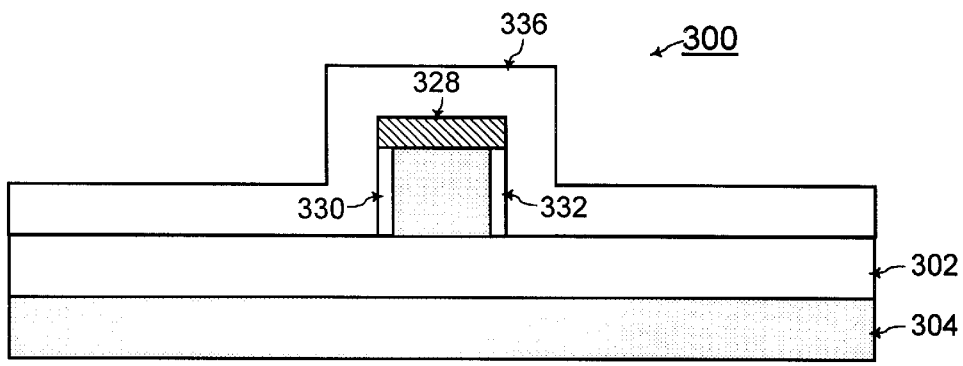

For forming the MOSFET 300 from the pillar 314, referring to FIG. 9, a gate electrode material 336 is deposited on the dielectric structure 328 on the top surface 316 of the pillar 314 and on the first gate dielectric 330 on the left side surface 318 of the pillar 314 and on the second gate dielectric 332 on the right side surface 320 of the pillar 314. Referring to the isometric view of the MOSFET 300 in FIG. 10, the gate electrode material 336 surrounds the pillar 314 at the top surface 316 and the left and right side surfaces 318 and 320 of the pillar 314 for the gate length 334 of the pillar 314. According to one embodiment of the present invention, the gate electrode material 336 is comprised of one of poly-silicon or poly-silicon germanium (SiGe) with a thickness in a range of from about 50 nanometers to about 200 nanometers. Processes for deposition of such gate electrode material 336 are known to one of ordinary skill in the art of integrated circuit fabrication. The cross-sectional view of FIG. 9 is along the dashed line B—B in FIG. 10.

Figure 11:
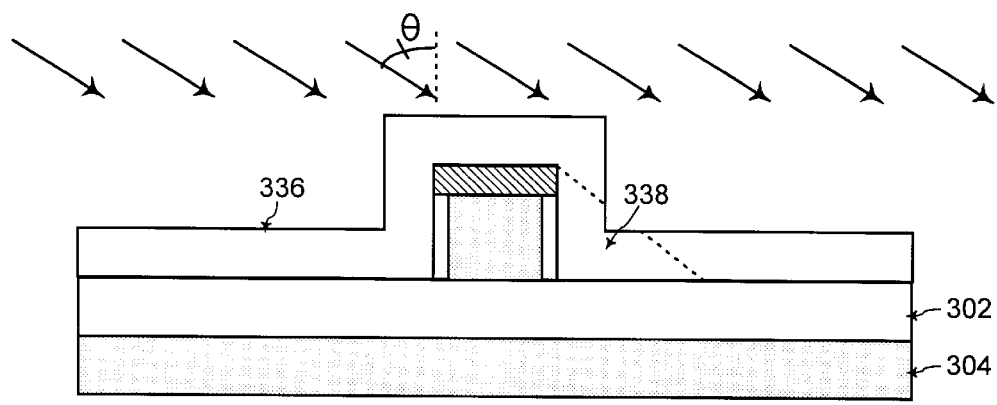

Referring to FIG. 11, a first gate dopant is implanted at an angle directed toward the gate electrode material 336 on the left side surface 318 of the pillar 314. In FIG. 11, the angle of implantation, θ, with respect to a vertical line that is perpendicular to the semiconductor substrate 304 is in a range of from about 30° to about 60°. Processes for angled implantation of dopant are known to one of ordinary skill in the art of integrated circuit fabrication. With such angled implantation, the first gate dopant is substantially not implanted into a right portion 338 (outlined by a dashed line in FIG. 11) of the gate electrode material 336 toward the right side surface 320 of the pillar 314 because of the shadowing effect from the dielectric structure 328 and the pillar 314.

Figure 12:
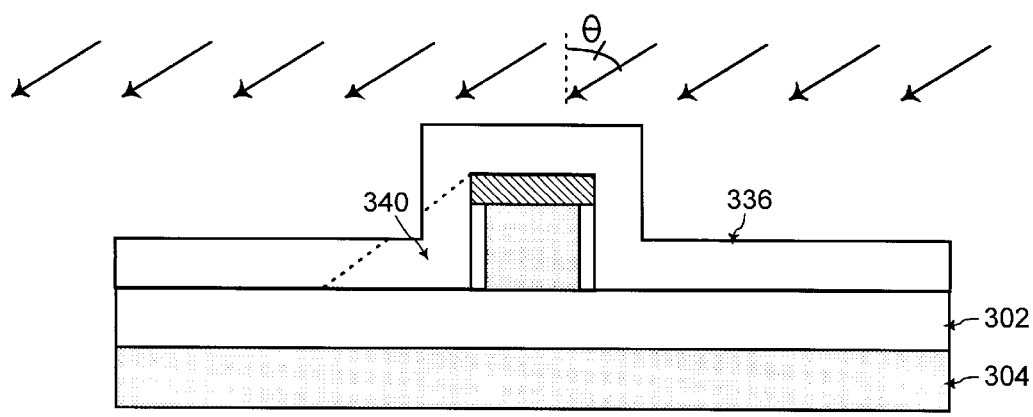

Similarly, referring to FIG. 12, a second gate dopant is implanted at an angle directed toward the gate electrode material 336 on the right side surface 320 of the pillar 314. In FIG. 12, the angle of implantation, θ, with respect to a vertical line that is perpendicular to the semiconductor substrate 304 is in a range of from about 30° to about 60°. Processes for angled implantation of dopant are known to one of ordinary skill in the art of integrated circuit fabrication. With such angled implantation, the second gate dopant is substantially not implanted into a left portion 340 (outlined by a dashed line in FIG. 12) of the gate electrode material 336 toward the left side surface 318 of the pillar 314 because of the shadowing effect from the dielectric structure 328 and the pillar 314.

Referring to FIGS. 11 and 12, the right portion 338 of the gate electrode material 336 toward the right side surface 320 of the pillar 314 has substantially only the second gate dopant implanted therein, and the left portion 340 of the gate electrode material 336 toward the left side surface 318 of the pillar 314 has substantially only the first gate dopant implanted therein. In a general aspect of the present invention, the first gate dopant is different from the second gate dopant for lowering the threshold voltage at the gate electrode material 336 forming the gate of the MOSFET 300. For example, the first gate dopant may be comprised of an N-type dopant such as phosphorous or arsenic, and the second gate dopant may be comprised of a P-type dopant such as boron.

Because the pillar 314 has a relatively small width in a range of from about 100 521 (angstroms) to about 250 Å (angstroms) between the first gate dielectric 330 and the second gate dielectric 332, the pillar 314 is fully depleted during operation of the MOSFET 300. Thus, in the prior art, when the gate electrode material 336 is doped with just one type of dopant such as an N-type dopant, the threshold voltage at the gate of a MOSFET is relatively high such as about 0.6 Volts. However, in a general aspect of the present invention, when two different types of dopants are implanted into the gate electrode material 336 at the left and right side surfaces 318 and 320 of the pillar 314, the threshold voltage at the gate of the MOSFET 300 is lowered to be less than about 0.4 Volts, and preferably in a range of from about 0.2 Volts to about 0.3 Volts. Such a low threshold voltage may be achieved for example when the concentration of the N-type dopant as the first gate dopant implanted in the left portion 340 of the gate electrode material 336 is in a range of from about $3\times10^{19}$ to about $1\times10^{21}$ dopants per cm$^3$ and when the concentration of the P-type dopant as the second gate dopant implanted in the right portion 338 of the gate electrode material 336 is in a range of from about $3\times10^{19}$ to about $1\times10^{21}$ dopants per cm$^3$.

Figure 10:
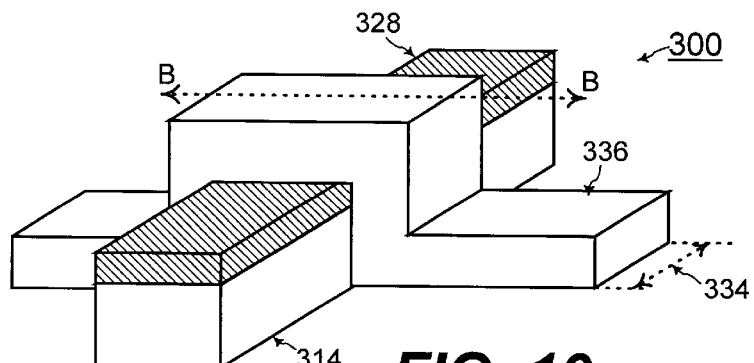
Figure 13:
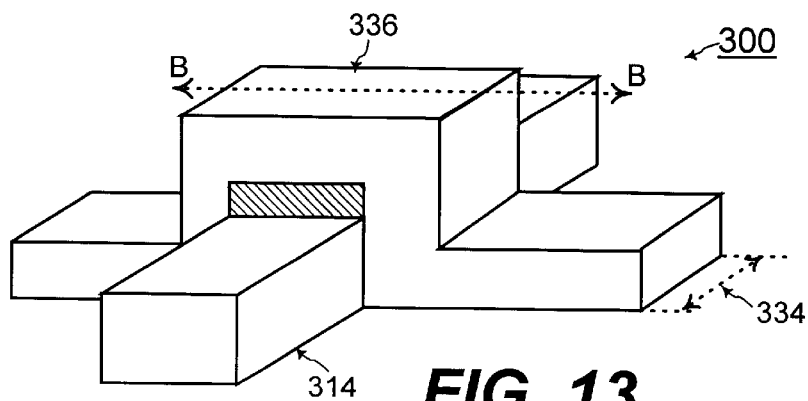

Referring to FIGS. 10 and 13, any exposed regions of the dielectric structure 328 of dielectric hardmask material not covered by the gate electrode material 336 is etched away. Processes for etching away exposed regions of the dielectric structure 328, which may be comprised of silicon nitride (Si$_3$N$_4$) for example, are known to one of ordinary skill in the art of integrated circuit fabrication.

Figure 14:
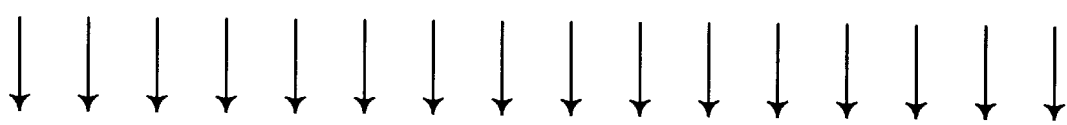
Figure 14:
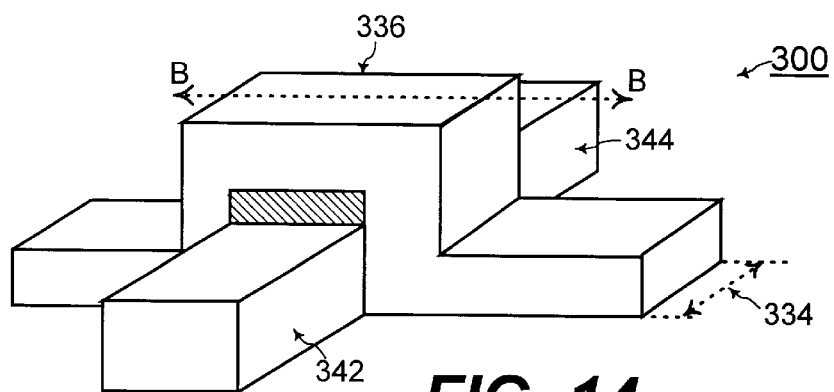

Referring to FIG. 14, a drain and source dopant is implanted into the exposed regions of the pillar 314 to form a drain 342 of the MOSFET 300 at a first side of the gate electrode material 336 toward the front side surface 319 along the length 322 of the pillar 314 and to form a source 344 of the MOSFET 300 at a second side of the gate electrode material 336 toward a back side surface 321 along the length 322 of the pillar 314. The drain and source dopant is an N-type dopant for forming the drain 342 and the source 344 of an NMOSFET (N-channel Metal Oxide Semiconductor Field Effect Transistor). Alternatively, the drain and source dopant is a P-type dopant for forming the drain 342 and the source 344 of a PMOSFET (P-channel Metal Oxide Semiconductor Field Effect Transistor). Processes for implantation of the drain and source dopant for formation of the drain 342 and the source 344 are known to one of ordinary skill in the art of integrated circuit fabrication.

In this manner, by implanting the first gate dopant and the second gate dopant that are different asymmetrically into the gate electrode material 336, the threshold voltage of the MOSFET 300 is lowered such that the dimensions of the field effect transistor may be further scaled down with scaling down of the bias voltages. Such lower bias voltages are also advantageous for use of the MOSFET 300 in low power applications.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "side," "left," "right," "front," and "back" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a field effect transistor on a semiconductor substrate in SOI (semiconductor on insulator) technology, the method including the steps of:
   A. forming a pillar of semiconductor material on a layer of buried insulating material, wherein said pillar has a top surface, a left side surface, a right side surface, a front side surface, and a back side surface, and wherein said pillar has a width and a length;
   B. forming a dielectric structure comprised of a hardmask dielectric material on said top surface of said pillar;
   C. forming a first gate dielectric on said left side surface of said pillar and forming a second gate dielectric on said right side surface of said pillar, along a gate length of said length of said pillar;
   D. depositing a gate electrode material on said dielectric structure and on said first gate dielectric and said second gate dielectric to surround said pillar at said top surface and said left and right side surfaces of said pillar for said gate length of said pillar;
   E. implanting a first gate dopant at an angle directed toward said gate electrode material on said left side surface of said pillar such that said first gate dopant is not implanted into said gate electrode material on said right side surface of said pillar; and
   F. implanting a second gate dopant at an angle directed toward said gate electrode material on said right side surface of said pillar such that said second gate dopant is not implanted into said gate electrode material on said left side surface of said pillar;
   wherein said first gate dopant is different from said second gate dopant such that a threshold voltage at said gate electrode material of said field effect transistor is less than about 0.4 Volts.

2. The method of claim 1, wherein said first gate dopant is an N-type dopant, and wherein said second gate dopant is a P-type dopant.

3. The method of claim 2, wherein said gate electrode material is comprised of one of polysilicon or polysilicon germanium.

4. The method of claim 3, wherein said first gate dopant is one of phosphorous or arsenic, and wherein said second gate dopant is boron.

5. The method of claim 1, wherein said first gate dopant and said second gate dopant are implanted at an angle in a range of from about 30 degrees to about 60 degrees with respect to a vertical line perpendicular to said semiconductor substrate.

6. The method of claim 1, wherein said pillar is comprised of silicon, and wherein said first gate dielectric and said second gate dielectric are comprised of silicon dioxide having a thickness in a range of from about 15 Å (angstroms) to about 25 Å (angstroms).

7. The method of claim 6, wherein said dielectric structure on said top surface of said pillar is comprised of silicon nitride.

8. The method of claim 1, further comprising the step of:
   implanting a drain and source dopant into exposed regions of said pillar to form a drain of said field effect transistor on a first side of said gate electrode material along said length of said pillar toward said front side surface of said pillar and to form a source of said field effect transistor on a second side of said gate electrode material along said length of said pillar toward said back side surface of said pillar.

9. The method of claim 8, wherein said drain and source dopant is an N-type dopant for fabrication of an NMOSFET (N-channel Metal Oxide Semiconductor Field Effect Transistor).

10. The method of claim 8, wherein said drain and source dopant is a P-type dopant for fabrication of a PMOSFET (P-channel Metal Oxide Semiconductor Field Effect Transistor).

11. The method of claim 1, wherein said step A includes the steps of:
    depositing said layer of buried insulating material on said semiconductor substrate;
    depositing a layer of said semiconductor material of said pillar on said layer of buried insulating material;
    depositing a layer of said hardmask dielectric material on said layer of semiconductor material;
    patterning and etching a layer of photoresist material to mask said layer of hardmask dielectric material and said layer of semiconductor material of said pillar for said width and said length of said pillar; and
    etching any region of said layer of hardmask dielectric material and said layer of semiconductor material not masked by said photoresist material to form said pillar of said semiconductor material with said hardmask dielectric material remaining to form said dielectric structure on said top surface of said pillar.

12. The method of claim 11, wherein said layer of said semiconductor material of said pillar has a thickness in a range of from about 300 Å (angstroms) to about 600 Å (angstroms).

13. The method of claim 1, wherein said width of said pillar is in a range of from about 100 Å (angstroms) to about 250 Å (angstroms).

* * * * *